United States Patent
Takagi et al.

(10) Patent No.: US 7,767,041 B2
(45) Date of Patent: Aug. 3, 2010

(54) AG-BI-BASE ALLOY SPUTTERING TARGET, AND METHOD FOR PRODUCING THE SAME

(75) Inventors: Katsutoshi Takagi, Kobe (JP); Junichi Nakai, Kobe (JP); Yuuki Tauchi, Kobe (JP); Toshiki Sato, Kobe (JP); Hitoshi Matsuzaki, Takasago (JP); Hideo Fujii, Takasago (JP)

(73) Assignees: Kabushiki Kaisha Kobe Seiko Sho, Kobe-shi (JP); Kobelco Research Institute Inc., Kobe-shi (JP)

( * ) Notice: Subject to any disclaimer, the term of this patent is extended or adjusted under 35 U.S.C. 154(b) by 662 days.

(21) Appl. No.: 10/844,345

(22) Filed: May 13, 2004

(65) Prior Publication Data

US 2004/0226818 A1 Nov. 18, 2004

(30) Foreign Application Priority Data

May 16, 2003 (JP) .............................. 2003-139293

(51) Int. Cl.
*C22C 5/06* (2006.01)
*C22F 1/14* (2006.01)
(52) U.S. Cl. .................. 148/430; 148/678; 420/501
(58) Field of Classification Search ............... 148/430, 148/678; 420/501, 505, 506
See application file for complete search history.

(56) References Cited

U.S. PATENT DOCUMENTS

| | | | | | |
|---|---|---|---|---|---|
| 4,810,308 A | * | 3/1989 | Eagar et al. | ........... | 148/538 |
| 5,972,131 A | * | 10/1999 | Asada et al. | ........... | 148/430 |
| 7,161,246 B2 | * | 1/2007 | Farrar | ........... | 257/741 |
| 2004/0028912 A1 | * | 2/2004 | Tauchi et al. | ........... | 428/434 |
| 2004/0238356 A1 | | 12/2004 | Matsuzaki et al. | | |
| 2005/0112019 A1 | | 5/2005 | Nakai et al. | | |
| 2006/0182991 A1 | | 8/2006 | Tauchi et al. | | |
| 2008/0317993 A1 | | 12/2008 | Tauchi et al. | | |

FOREIGN PATENT DOCUMENTS

| JP | 52013688 A | * | 2/1977 |
|---|---|---|---|
| JP | 2001184725 A | * | 7/2001 |
| JP | 2004-139712 | | 5/2004 |

OTHER PUBLICATIONS

"ASM Handbook: vol. 3 Alloy Phase Diagrams", ASM International, 1992, p. 26.*
D.A. Skoog, et al., "Fundamentals of Analytical Chemistry", Third Edition, Ch 4, pp. 78-80, 1976.

* cited by examiner

*Primary Examiner*—Roy King
*Assistant Examiner*—Janelle Morillo
(74) *Attorney, Agent, or Firm*—Oblon, Spivak, McClelland, Maier & Neustadt, L.L.P.

(57) ABSTRACT

The sputtering target made of a Ag—Bi-base alloy contains Bi in solid solution with Ag. The sputtering target has an intensity of precipitated Bi of 0.01 at %$^{-1}$ or less, as calculated by the following mathematical expression (1) based on analysis results of X-ray diffraction, and/or a sum of area ratios of predetermined intensities (third to sixth intensities in 8 intensities) of 89% or more, wherein the area ratios are obtained by calculating a planar distribution of characteristic X-ray intensities of Bi according to X-ray microanalysis: intensity of precipitated Bi=$[I_{Bi(102)}/I_{Ag(111)}+I_{Ag(200)}+I_{Ag(220)}+I_{Ag(311)})]/$[Bi]. Remarkable lowering of the yield of Bi content in resultant films can be suppressed by using the sputtering target.

16 Claims, 6 Drawing Sheets

AG-BI-BASE ALLOY SPUTTERING TARGET, AND METHOD FOR PRODUCING THE SAME

BACKGROUND OF THE INVENTION

1. Field of the Invention

The present invention relates to Ag—Bi-base alloy sputtering targets useful in forming Ag—Bi-base alloy films by sputtering, a method for manufacturing the sputtering targets, and a method for producing the Ag—Bi-base alloy films using the sputtering targets.

2. Description of the Related Art

Ag-base films (hereinafter, simply called as "Ag films") made of pure Ag or Ag alloy are superior in optical properties such as high reflectance and high transmittance, and low extinction coefficient, superior in thermal properties such as thermal conductivity, superior in electrical properties such as low electrical resistivity, and are superior in surface fineness. Owing to these properties, the Ag films are widely used as reflective films, semi-transparent reflective films, and heat diffusion films for optical information recording media, reflective electrode films or interconnection films for flat panel displays, Low-E films for heat-ray reflecting/shielding glasses, shield films of shielding electromagnetic waves, and the like.

Numerous study on improvement of sputtering targets to be used in forming the Ag films having these superior properties has been made (see Japanese Unexamined Patent Publication No. 9-324264, and Japanese Unexamined Patent Publication No. 2000-239835). Japanese Unexamined Patent Publication No. 9-324264 discloses forming a sputtering target made of a silver alloy containing gold in the range of from 0.1 to 2.5 at % and copper in the range of from 0.3 to 3 at %, or of a silver-base composite metal is advantageous in preventing adverse effects by gas atmosphere such as oxygen supplied in sputtering, such as lowering of optic transmittance/optic reflectance in a short wavelength band of a visible rays range. Japanese Unexamined Patent Publication No. 2000-239835 recites setting a ratio in crystal orientation of the Ag sputtering target, namely, ((111)+(200))/(220) at 2.20 or more is effective in raising a sputtering rate, and accordingly, raising film production efficiency.

As mentioned above, the Ag films are superior in optical properties, thermal properties, and electrical properties owing to the aforementioned various improvements. Despite these superior properties, the currently available Ag films may encounter deterioration resulting from oxidation, corrosion, cohesion, peeling-off, or other factor in the case where applied products of the Ag films are placed in an environment of use for a long term. In view of this, there is a demand for securing stable, long-term use of the films.

For instance, pure Ag films obtained by sputtering of the conventional sputtering target have a multitude of crystal defects such as vacancy, dislocation, and grain boundary. Ag atoms may likely to easily migrate into these crystal defects. For example, if the pure Ag films are stored under a condition of high temperature and high humidity, Ag atoms may likely to migrate and cohere (condense) at the defective locations, with the result that the surface roughness may be raised and oversized growth of crystal grains may appear. Likewise, Ag atoms may likely to easily migrate and cohere (condense) in an environment containing halogen ions such as chlorine ions.

The inventors made an extensive study on securing stable, long-term use of Ag films, and filed a patent application identified by Japanese Patent Application No. 2002-361117. In this study, following is discovered: when prepared is a composite sputtering target constructed such that chips of various elements as additive elements are placed on a sputtering target made of pure Ag, and Ag—Bi-base alloy films are formed from such a composite sputtering target, the Ag—Bi-base alloy film such as Ag—Bi alloy films, Ag—Bi—Nd alloy films, Ag—Bi—Y alloy films, Ag—Bi—Cu alloy films, Ag—Nd—Au alloy films, Ag—Bi—Nd—Cu alloy films, Ag—Bi—Nd—Au alloy films, Ag—Bi—Y—Cu alloy films, and Ag—Bi—Y—Au alloy films is effective in preventing cohesion (aggregation) of Ag atoms in the presence of halogen ions, and in securing stable, long-term use of the Ag films.

However, as mentioned in the specification, there is a tendency that the Bi content in the film decreases, as compared with the Bi content in the sputtering target in forming the Ag—Bi-base alloy films. Further, a material damage such as cracking is found in a process of producing sputtering targets made of the Ag—Bi-base alloy comprising the steps of: melting Ag with Bi to produce ingots, and hot-working the ingots of Ag—Bi-base alloy. It is conceived that such a damage occurs because of low workability of the Ag—Bi-base alloy ingots.

SUMMARY OF THE INVENTION

In view of the above, it is an object of the present invention to provide a Ag—Bi-base alloy sputtering target capable of suppressing remarkable lowering of the yield of the Bi content in films (=Bi content in the film/Bi content in the sputtering target), a method for manufacturing the sputtering target, and a method for producing Ag—Bi-base alloy films using the sputtering target.

A sputtering target made of a Ag—Bi-base alloy according to the present invention has a feature that in the sputtering target a solid solution of Bi is formed with Ag.

According to an aspect of the present invention, a sputtering target made of a Ag—Bi-base alloy has an average intensity of precipitated Bi of 0.01 at $\%^{-1}$ or less, as represented by the following mathematical expression, the average intensity being obtained by selecting plural sites on a sputtering surface of the sputtering target and by measuring peak intensities of X-ray diffraction, according to an X-ray diffraction method, with respect to the Ag (111) plane, the Ag (200) plane, the Ag (220) plane, the Ag (311) plane, and the Bi (102) plane, intensity of precipitated Bi=$[I_{Bi(102)}/(I_{Ag(111)}+I_{Ag(200)}+I_{Ag(220)}+I_{Ag(311)})]/[Bi]$ where $I_{Bi(102)}$ represents a peak intensity (unit: counts per second (cps), the unit is the same in the following) of X-ray diffraction with respect to the Bi (102) plane; $I_{Ag(111)}$ represents a peak intensity of X-ray diffraction with respect to the Ag (111) plane; $I_{Ag(200)}$ represents a peak intensity of X-ray diffraction with respect to the Ag (200) plane; $I_{Ag(220)}$ represents a peak intensity of X-ray diffraction with respect to the Ag (220) plane; and $I_{Ag(311)}$ represents a peak intensity of X-ray diffraction with respect to the Ag (311) plane, and [Bi] represents a content of Bi (unit: at %) in the sputtering target made of the Ag—Bi-base alloy.

According to another aspect of the present invention, a sputtering target made of a Ag—Bi-base alloy has a sum of area ratios of a third intensity through a sixth intensity of 89% or more, the area ratios being calculated by measuring a planar distribution of characteristic X-ray intensities of Bi on a sputtering surface of the sputtering target according to X-ray microanalysis, the characteristic X-ray intensities being proportionally classified into 8 levels from a first intensity corresponding to a lowest level to an eighth intensity corresponding to a highest level, and respective area ratios of the first intensity through the eighth intensity being calculated, wherein the sum of the respective areas representing the first intensity through the eighth intensity is 100%.

These and other objects, features and advantages of the present invention will become more apparent upon reading of the following detailed description along with the accompanying drawings.

DETAILED DESCRIPTION OF THE PREFERRED EMBODIMENTS

Figure 1:
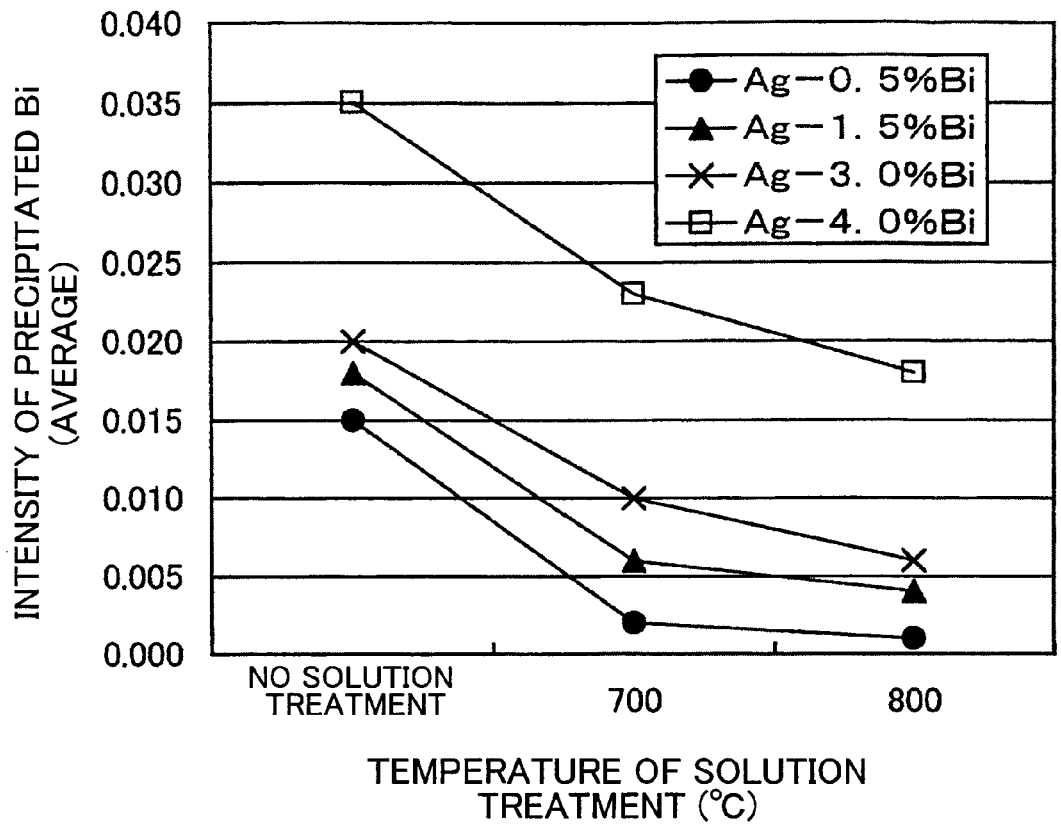
FIG. 1 is a graph showing correlations between cases where a solution treatment is implemented and a case where the solution treatment is not implemented, and intensity of precipitated Bi.

As a result of an extensive study to solve the problems residing above, the inventors elucidated that the following phenomenon relating to use of Ag—Bi-base alloy is involved with the problems. Specifically, Ag—Bi-base alloy has properties: (1) the alloy is a eutectic alloy; (2) the solid solution range of Bi with Ag is narrow; and (3) the melting point (about 271° C.) of Bi is extremely low, as compared with the melting point (about 962° C.) of Ag. Due to these properties of the Ag—Bi-base alloy, there rises a problem that segregation of Bi of single phase is likely to appear in crystal grain boundaries of Ag. If ingots having such Bi segregation are subjected to hot working, such as forging and rolling, at a temperature of about 350 to 830° C., in a worst case, the segregated region of Bi which is segregated due to the low-melting point of Bi may be melted, and a material damage such as cracking may start from the melted region. Even if such a material damage does not occur, and a final product of Ag—Bi-base alloy sputtering target is obtained, the yield of the Bi content in resulting films produced by sputtering the sputtering target is remarkably lowered, because there is a great difference in Bi sputtering yield between the Bi segregated region and the Bi non-segregated region.

In view of the above, the inventors found that formation of a solid solution of Bi to suppress non-uniform distribution of Bi such as Bi segregation is advantageous in suppressing a material damage during hot working and in suppressing remarkable lowering of the yield of the Bi content in resulting films, and thus, accomplished the present invention.

Hereinafter, preferred embodiments of the present invention will be described in detail.

A sputtering target made of a Ag—Bi-base alloy according to an embodiment of the present invention has a feature that a solid solution of Bi is formed with Ag in the sputtering target, whereas a conventional sputtering target is such that Bi chips are simply placed on a pure Ag sputtering target. Formation of the solid solution of Bi with Ag is effective in suppressing non-uniform distribution of Bi such as segregation of Bi, thereby contributing to suppressing remarkable lowering of the yield of Bi content in films. Further, suppressing non-uniform distribution of Bi is advantageous in suppressing a material damage which may occur in producing Ag—Bi-base alloy sputtering targets containing Ag and Bi by hot working such as rolling and forging.

The degree of forming a solid solution of Bi, namely, the degree of segregation of Bi can be evaluated by measuring a peak intensity of X-ray diffraction with respect to precipitated Bi, more exactly, a relative intensity of a peak intensity of X-ray diffraction with respect to precipitated Bi per atomic percent (at %) of the Bi content (hereinafter, simply called as "intensity of precipitated Bi"), or by examining a planar distribution of characteristic X-ray intensities of Bi, more exactly, the area ratios of characteristic X-ray intensities of Bi on a sputtering surface of the sputtering target where the characteristic X-rays in a predetermined intensity range are incident in examining the planar distribution of the characteristic X-ray intensities of Bi (hereinafter, simply called as "distribution of Bi atoms").

The intensity of precipitated Bi can be obtained by measuring a peak intensity of X-ray diffraction of a Ag—Bi-base alloy sputtering target, according to an X-ray diffraction method, with respect to the (111) plane of Ag, the (200) plane of Ag, the (220) plane of Ag, the (311) plane of Ag, and the (102) plane of Bi, and by obtaining a relative intensity of a peak intensity of X-ray diffraction with respect to the (102) plane of Bi, based on the following mathematical expression:

intensity of precipitated Bi=[$I_{Bi(102)}/(I_{Ag(111)}+I_{Ag(200)}+I_{Ag(220)}+I_{Ag(311)})$]/[Bi]

where: $I_{Bi(102)}$ represents a peak intensity (unit: counts per second (cps), the unit is the same in the following) of X-ray diffraction with respect to the Bi (102) plane; $I_{Ag(111)}$ represents a peak intensity of X-ray diffraction with respect to the Ag (111) plane; $I_{Ag(200)}$ represents a peak intensity of X-ray diffraction with respect to the Ag (200) plane; $I_{Ag(220)}$ represents a peak intensity of X-ray diffraction with respect to the Ag (220) plane; and $I_{Ag(311)}$ represents a peak intensity of X-ray diffraction with respect to the Ag (311) plane, and [Bi] represents the Bi content (unit: at %) in the Ag—Bi-base alloy sputtering target.

In order to accurately evaluate the properties of the sputtering target, arbitrary plural sites on the sputtering surface of the sputtering target are selected, for instance, arbitrary about five or more sites (preferably, about five or more different sites substantially equidistantly away from each other) in the case where the sputtering surface has an area of about 400 $cm^2$, the intensities of precipitated Bi at the selected sites are measured, and an average of the measured intensities is set as an intensity of precipitated Bi on the sputtering target.

The less the intensity of precipitated Bi is, the more effectively segregation of single-phase Bi is suppressed. Accordingly, producing a sputtering target having a small intensity of precipitated Bi is effective in suppressing a material damage starting from the single-phase Bi segregated region. The intensity (average intensity) of precipitated Bi is about 0.01 at %$^{-1}$ or less, e.g., about 0.014 at %$^{-1}$ or less, preferably, 0.013 at %$^{-1}$ or less, and more preferably, 0.011 at %$^{-1}$ or less. A particularly recommended average intensity of precipitated Bi is 0.005 at %$^{-1}$ or less, for example, 0.002 at %$^{-1}$ or less.

The distribution of Bi atoms can be calculated by measuring a planar distribution of characteristic X-ray intensities of Bi on the sputtering surface of the sputtering target by X-ray microanalysis. More specifically, the characteristic X-ray intensities are proportionally classified into 8 levels from the first intensity (lowest level) to the eighth intensity (highest level), and the respective area ratios of these 8 intensities are calculated, wherein the sum of the respective areas representing these 8 intensities is 100%. Then, the sum of the area ratios of the third through sixth intensities is calculated to estimate the distribution of Bi atoms.

The larger the sum of the area ratios of the third through sixth intensities is, the more uniformly the solid solution of Bi is formed, while suppressing non-uniform distribution of Bi. Producing a sputtering target having such a large sum of the area ratios is effective in suppressing remarkable lowering of the yield of the Bi content in the resultant films. In view of this, the sum of the area ratios of the third through sixth intensities is about 89% or more, preferably, 95% or more, and more preferably, 98% or more.

Generally, a sputtering target having a smaller crystal grain size is preferred. It is conceived that a sputtering target having a large crystal grain size may result in film formation of uneven thickness or failure of uniform composition distribution in the films. In view of this, it is desirable that the inventive Ag—Bi-base alloy sputtering target has a small average crystal grain size, for instance, about 200 μm or less, preferably about 100 μm or less, and more preferably about 50 μm or less.

The crystal grain size is calculated as follows:
step 1) Taken is an optical micrograph of the surface of each Ag—Bi-base alloy sputtering target to be sputtered. The larger the magnification ratio of the microscope is, the more accurately the crystal grain size can be measured. Normally, the magnification ratio is set about 100 to 500 times.
step 2) Four or more straight lines are drawn on each of the optical micrographs in a double-cross manner (see FIG. 8). The larger the number of the straight lines is, the more accurately the crystal grain size can be measured.
step 3) The number n of the crystal grain boundaries appearing on each straight line is counted, and the crystal grain size d (unit: μm) of the crystal grain boundary or boundaries appearing on each of the straight lines is calculated based on the following equation:

$d=L/n/m$ where L denotes the length of the straight line, n denotes the number of the crystal grain boundaries appearing on the straight line, and m denotes the magnification ratio of the optical micrograph.
step 4) The average of the crystal grain sizes d obtained with respect to the respective straight lines is set as an average crystal grain size of the sputtering target.

The Bi content is not specifically limited, as far as a solid solution of Bi is formed in the Ag—Bi-base alloy sputtering target, namely, as far as a predetermined intensity of precipitated Bi is obtainable, or a predetermined distribution of Bi atoms is obtainable. However, the Bi content is, for example, 3 at % or less excluding 0 at %, preferably, 2 at % or less, and more preferably, 1 at % or less. Reducing the Bi content makes it possible to achieve substantially complete formation of Bi solid solution by a solution treatment, which will be described later. By achieving such a complete formation of Bi solid solution, the intensity of precipitated Bi can be minimized, and the distribution of Bi atoms, namely, the sum of area ratios of the third through sixth intensities can be maximized. A larger Bi content in the sputtering target is advantageous in obtaining Ag—Bi-base alloy films having high thermal conductivity, high reflectance, and high durability, with use of the inventive Ag—Bi-base alloy sputtering target. For instance, the Bi content is 0.1 at % or more, and preferably, 0.5 at % or more. The Bi content may be 1.0 at % or more, e.g., 1.5 at % or more.

The Ag—Bi-base alloy sputtering target may be substantially composed of Ag and Bi alone. Alternatively, various metal elements (hereinafter, called as "supportive metal elements") to secure or improve film properties may be added to such an extent as not to impair the effects of the embodiment of the present invention. The supportive metal elements include, but are not limited thereto: elements that form a solid solution with Ag in the Ag—Bi-base alloy, such as Mg, Pd, Pt, Au, Zn, Al, Ga, In, Sn, Sb, Li, Cd, Hg, and As (hereinafter called as "first supportive metal elements"), preferably, Mg, Pd, Pt, Au, Zn, Al, Ga, In, Sn, and Sb, more preferably, Pd, Pt, and Au; elements that are precipitated as single phase metals in the Ag—Bi-base alloy, such as Be, Ru, Rh, Os, Ir, Cu, Ge, V, Nb, Ta, Cr, Mo, W, Mn, Re, Fe, Co, Ni, Si, Tl, and Pb (hereinafter, called as "second supportive metal elements"), preferably, Be, Ru, Rh, Os, Ir, Cu, and Ge, more preferably, Rh and Cu; and elements that are precipitated as intermetallic compounds with Ag in the Ag—Bi-base alloy, such as Y, La, Ce, Nd, Sm, Gd, Tb, Dy, Ti, Zr, Hf, Na, Ca, Sr, Ba, Sc, Pr, Eu, Ho, Er, Tm, Yb, Lu, S, Se, and Te (hereinafter, called as "third supportive metal element"), preferably, Y, La, Ce, Nd, Sm, Gd, Tb, Dy, Ti, Zr, and Hf, more preferably, Y and Nd. The first supportive metal elements may be used alone or in combination of two or more kinds thereof. Likewise, the second supportive metal elements (or the third supportive metal elements) may be used alone or in combination of two or more kinds thereof. Further alternatively, the first, second, and third supportive metal elements may be used alone or in combination of two or more kinds thereof.

It is desirable to add the supportive metal element to such a degree as not to impair the basic properties of the Ag—Bi-base alloy films, such as high reflectance, high transmittance, low extinction coefficient, high thermal conductivity, and low electrical resistivity. In view of this, it is recommended that the total content of the supportive metal elements be, for example, 5 at % or less, preferably, 3 at % or less, and more preferably 2 at % or less.

The inventive Ag—Bi-base alloy sputtering target containing a solid solution of Bi, in other words, having a predetermined intensity of precipitated Bi, or having a predetermined distribution of Bi atoms can be produced by allowing Ag—Bi-base alloy products, such as ingots of Ag—Bi-base alloy obtained by melting Ag with Bi, or processed products thereof to go into a solution treatment (solid solution process) where a solid solution of Bi is formed with Ag. Implementing the solution treatment makes it possible to form the solid solution of Bi with Ag, thereby suppressing segregation of Bi.

The solution treatment conditions are optionally settable, as far as there is secured sufficient formation of a solid solution of Bi. For instance, the temperature for the solution treatment is about 350° C. or higher, preferably, about 400° C. or higher, more preferably about 500° C. or higher, and a particularly desired solution treatment temperature is about 600° C. or higher. A time for the solution treatment is about 0.3 hr or longer, preferably, about 0.5 hr or longer, more preferably, about 2 hr or longer, and a particularly desired solution treatment time is about 4 hr or longer. It is recommended to cool the Ag—Bi-base alloy products immediately after the solution treatment to prevent re-segregation of the Bi that has been uniformly distributed as the solid solution. The cooling rate after the solution treatment is, e.g., about 3° C./min or faster, preferably, about 5° C./min or faster, and more preferably about 10° C./min or faster, and furthermore preferably about 20° C./min or faster.

The solution treatment is effective in forming a solid solution of Bi. It is, however, recommended not to excessively carry out the solution treatment, considering a drawback that an excessive solution treatment may result in oversized growth of crystal grains. In view of this, it is preferable that the temperature for the solution treatment may not exceed e.g., 830° C., preferably, 800° C., and more preferably, 750° C. Also, it is preferable that the time for the solution treatment may not exceed e.g., 13 hr, preferably 10 hr, more preferably 8 hr, and particularly preferably 6 hr.

The timing of implementing the solution treatment is not particularly limited. An exemplified process for producing the Ag—Bi-base alloy sputtering target comprises: subjecting ingots of Ag—Bi-base alloy to hot working such as hot rolling, or hot forging into a predetermined shape; subjecting the resultant products to an appropriate process such as cold or warm working, or heat treatment, according to needs; and implementing machining such as cutting or shaving. The solution treatment can be implemented at any timing during the production process. As far as a solid solution of Bi can be formed in a sputtering target, such a sputtering target can suppress remarkable lowering of the yield of the Bi content in films obtained by sputtering the sputtering target.

It is desirable to carry out the solution treatment prior to the hot working step for the purpose of suppressing a material damage during the hot working step. In this arrangement, the solution treatment may be carried out independently of the hot working step, or alternatively, heat treatment, which is implemented immediately before the hot working step as an integral operation with the hot working step, may be carried out as the solution treatment.

The atmosphere to be drawn into a furnace in the solution treatment may be an air, an inert gas, or vacuum. The inner temperature of the furnace in loading the Ag—Bi-base alloy is required to be lower than the melting point (about 271° C.) of Bi. This is because a segregated region of Bi which is segregated due to the low melting point of Bi may be melted at the time of loading the Ag—Bi-base alloy.

Because the inventive Ag—Bi-base alloy sputtering target contains Bi, the sputtering target is useful in producing Ag—Bi-base alloy films of long-term use. Further, since a solid solution of Bi is formed despite the containment of the Bi, a material damage during production of the sputtering target can be suppressed, and the yield of the sputtering targets can be raised. Furthermore, this arrangement makes it possible to suppress remarkable lowering of the yield of the Bi content in films, thereby producing Ag—Bi-base alloy films having high thermal conductivity, high reflectance, and high durability.

The sputtering can be performed by a known technique, such as DC magnetron sputtering.

EXAMPLES

In the following, the present invention is illustrated in detail with Examples, which, however, do not limit the present invention. Adequate modification is allowable as far as it does not depart from the object of the present invention described above or below, and every such modification is intended to be embraced in the technical scope of the present invention.

In the Examples, the solution treatment is carried out according to the following procedures, and results of experiments are evaluated according to the below-stated method.

[Solution Treatment]

Loaded was a material for the solution treatment (in the Examples, ingots made of a Ag—Bi alloy or Ag—Bi-base alloy) into a furnace filled with an atmosphere of room temperature. After the inner temperature of the furnace was raised to a predetermined temperature α (unit: ° C.) at a raising rate of 50° C./hr, the predetermined temperature was maintained for a predetermined time β (unit: hr) to form a solid solution of Bi. Thereafter, the ingots were taken out of the furnace to air-cool the ingots at room temperature at a cooling rate of about 5° C./min. Thus, the solution treatment was implemented.

The solution treatment is indicated as "temperature: α(° C.)—time: β(hr)—cooling rate: 5° C./min" in the Examples.

[Bi Content]

A sample of about 1 g was scraped off from a test chip of 20 mm (length)×20 mm (width)×5 mm (thickness) each collected in the experiments, and the sample was almost completely dissolved in an aqueous solution of nitric acid [70 mass % of nitric acid: de-ionized water=1:1 in specific volume]. The solution was heated on a hot plate of 200° C. until complete dissolution of the sample was confirmed. Then, the solution was cooled, and the content of Bi in each sample was measured by inductively coupled plasma (ICP) mass spectrometry, with use of "SPQ-8000" (Seiko Instruments Inc.).

[Intensity of Precipitated Bi]

Five test chips of 20 mm (length)×20 mm (width)×5 mm (thickness) were collected substantially equidistantly, namely, in a uniform manner, from each ingot in the experiments, and peak intensities of X-ray diffraction with respect to the Ag (111) plane, the Ag (200) plane, the Ag (220) plane, the Ag (311) plane, and the Bi (102) plane, namely, the peak intensities $I_{Ag(111)}$, $I_{Ag(200)}$, $I_{Ag(220)}$, $I_{Ag(311)}$, and $I_{Bi(102)}$ (unit: cps) were measured according to an X-ray diffraction method under the following conditions. The intensity of precipitated Bi with respect to each test chip: $[I_{Bi(102)}/(I_{Ag(111)}+I_{Ag(200)}+I_{Ag(220)}+I_{Ag(311)})]/[Bi]$ was calculated, based on the measurements of the peak intensities, and the measurement result with respect to the Bi content (unit: at %), which was obtained as described in the above section of [Bi content]. Thus, an average of the intensities of precipitated Bi was obtained. X-ray diffraction conditions:

<Preprocess of Test Chips>

In the Examples, preprocess was not carried out because the surfaces of the test chips were smooth. It should be noted, however, that it is preferable to etch the surfaces of test chips with diluted nitric acid after wet grinding for the purpose of eliminating adverse effects resulting from surface distortion of the test chips by machining.

<Analyzer>

"RINT 1500" (Rigaku Corporation) was used.

<Measuring Conditions>
  target: Cu
  monochromatic radiation: Cu-Kα ray using a monochrometer output: 50 kV-200 mA
  slit: degree of divergence 1°, degree of diffusion: 1°, slit width for receiving light: 0.15 mm
  scanning speed: 4°/min
  sampling width: 0.02°
  scanning range (2θ): 10 to 130°

[Distribution of Bi Atoms]

A planar distribution of characteristic X-ray intensities of Bi in a test chip of 20 mm (length)×20 mm (width)×5 mm (thickness), each collected in the experiments, was examined according to X-ray microanalysis under the following conditions. Specifically, the characteristic X-ray intensities of Bi were proportionally classified into 8 levels from the first intensity (lowest level) to the eighth intensity (highest level), and the respective area ratios of these 8 intensities were calculated, wherein the sum of the respective areas representing these 8 intensities was 100%. Then, the sum of the area ratios of the third through sixth intensities, namely, the distribution of Bi atoms was calculated. X-ray microanalysis conditions:

<Preprocess of Test Chips>

The test chips were embedded in resin, and the surface of the resin was wet ground for analysis.

<Analyzer>
  "Electron Probe Micro Analyzer (EPMA) (combined WD/ED microanalyzer) JXA-8900RL" (JEOL Ltd.) was used.

<Measuring Conditions>
  type: stage scan
  acceleration voltage: 15 kV
  applied current for irradiation: 0.2 µA
  beam diameter: 1 µm
  irradiation time: 100 ms
  number of dots: 400×400
  irradiation interval: X-axis direction: 1.5 µm, Y-axis direction: 1.5 µm

[Workability]

Presence or absence of cracking on the hot-rolled plates respectively obtained in the experiments was examined by visual observation, and the results of observation were evaluated according to the following criteria.
  Good (G): no cracking of a length of 10 mm or longer was observed.
  No good (NG): cracking of a length of 10 mm or longer was observed.

[Lowering of Yield of Bi Content in Film]

The Bi content in each of the films made of a Ag—Bi-base alloy obtained in the experiments was measured according to ICP mass spectrometry in a similar manner as having been done with respect to the test chips. The mass of each film sample was 100 mg or more. The Bi content in the test chips, and the Bi content in the film samples were compared with each other, and the comparison results were evaluated according to the following criteria.
  Good (G): no lowering of the yield of the Bi content in the film was observed.
  No good (NG): lowering of the yield of the Bi content in the film was observed.

[Oversized Growth of Crystal Grain]

Figure 8:
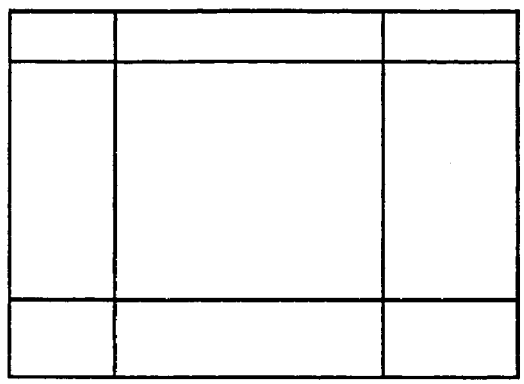
FIG. 8 is a conceptual diagram for explaining a method of determining the crystal grain size.

The test chips were embedded in resin, and the surface of the resin to be observed by an optical microscope was wet ground. Optical micrographs (magnification ratio: 400 times) of the preprocessed (wet-ground) surface of the resin were taken, and four straight lines in a double-cross manner, as shown in FIG. 8 were drawn on each micrograph. The number n of the crystal grain boundaries appearing on each straight line was counted, and the crystal grain size d (unit: µm) with respect to the crystal grain boundary or boundaries appearing on each of the straight lines was calculated, based on the following equation:

$$d = L/n/m$$

where L denotes the length of the straight line, n denotes the number of the crystal grain boundaries appearing on the straight line, and m denotes the magnification ratio of the optical micrograph.

The average of the crystal grain sizes obtained with respect to the four straight lines was set as an average crystal grain size of the test chip. Judgment as to whether the crystal grains outsized a predetermined value was evaluated, based on the average crystal grain size.
  Good (G): no oversized growth of crystal grains appeared. (average crystal grain size was 200 µm or less.)
  No good (NG): oversized growth of crystal grains appeared. (average crystal grain size exceeded 200 µm.)

Example 1

Ag and Bi whose compositions had been adjusted were inductively melted under Ar gas atmosphere, and produced were four different kinds of Ag—Bi alloy ingots each having a different Bi content, namely, Ag with Bi of 0.5 at %, Ag with Bi of 1.5 at %, Ag with Bi of 3.0 at %, and Ag with Bi of 4.0 at %. Three different kinds of treatments were performed with respect to each of the four Ag—Bi alloy ingots: the first treatment was no solution treatment; the second treatment was a solution treatment of temperature: 700(° C.)—time: 10(hr)—cooling rate: 5° C./min; and the third treatment was a solution treatment of temperature: 800(° C.)—time: 10(hr)—cooling rate: 5° C./min.

After either one of the three treatments was implemented, these ingots were subjected to hot working at a hot work initiate temperature of 700° C., and rolling reduction [={(plate thickness before hot rolling)−(plate thickness after hot rolling)}/(plate thickness before hot rolling)] of 50%. Thus, hot rolled plates were produced. These hot rolled plates were subjected to cold rolling (rolling reduction: 50%) and heat treatment (temperature: 600° C., time: 1.5 hr). Thus, sputtering targets (diameter: 101.6 mm, thickness: 5 mm), and a certain number of test chips of 20 mm (length)×20 mm (width)×5 mm (thickness) necessary for implementing the experiments were obtained by cutting or shaving the heat-treated plates.

Figure 2:
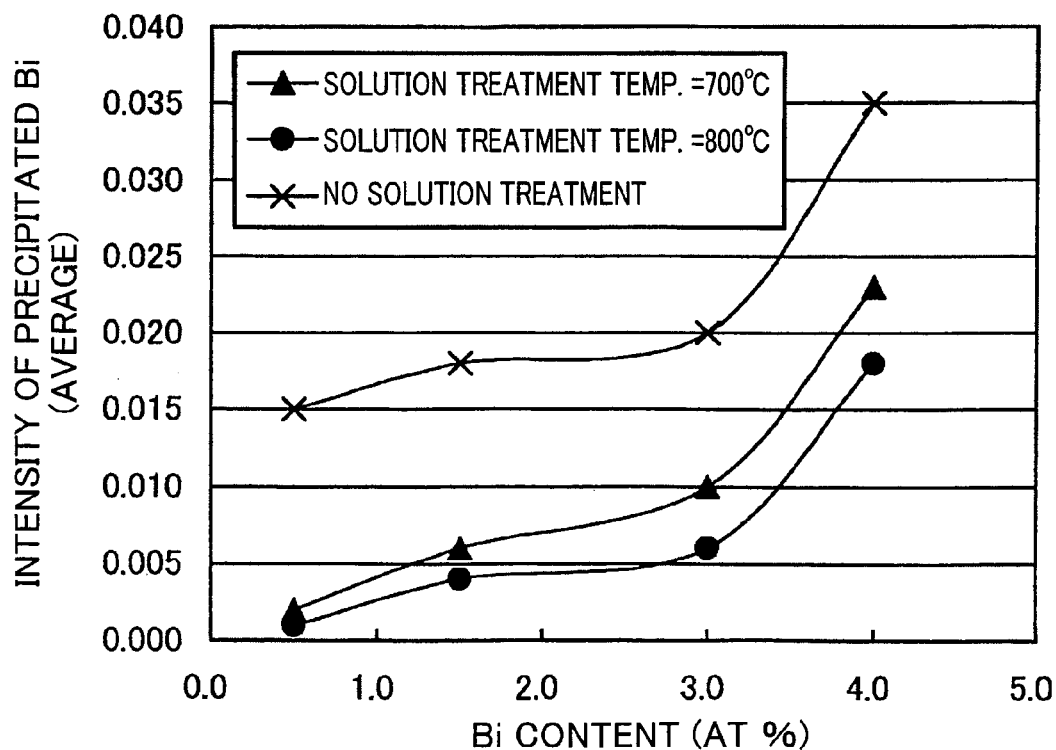
FIG. 2 is a graph showing correlations between the Bi content in sputtering targets, and intensity of precipitated Bi with respect to cases where the solution treatment is implemented and a case where the solution treatment is not implemented.
Figure 3:
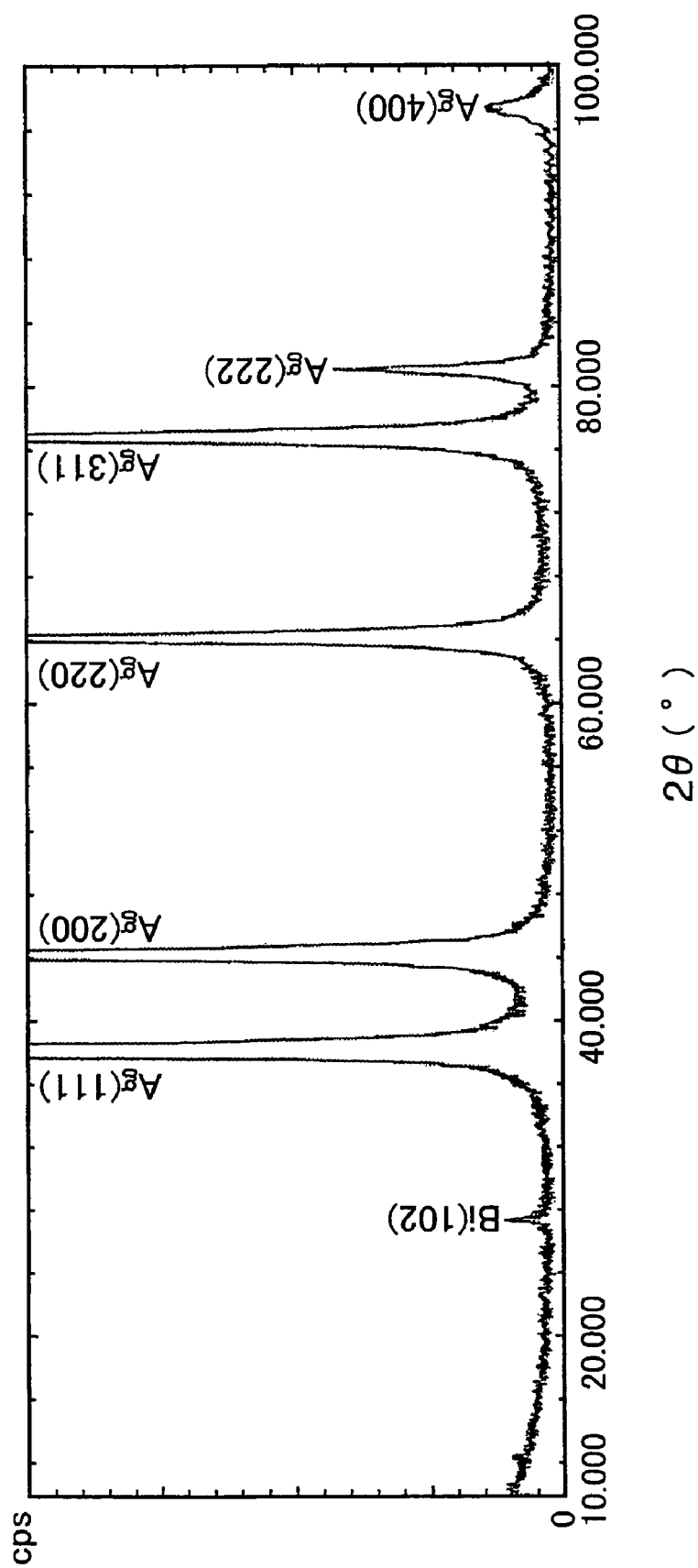
FIG. 3 is an illustration showing an X-ray diffraction pattern of sample No. 4 in Example 1.

The evaluation results of Example 1 are shown in Table 1, and FIGS. 1 to 2. An X-ray diffraction analysis result of sample No. 4 is shown in FIG. 3.

TABLE 1

| Sample No. | Bi content in target [at %] | Solution treatment conditions | | | X-ray diffraction analysis | | | | | | | |
|---|---|---|---|---|---|---|---|---|---|---|---|---|
| | | | | | Result on a test chip | | | | | | Intensity of precipitated Bi (average) [at %$^{-1}$] | Workability |
| | | Temp. [° C.] | Time [hr] | Cooling rate [° C./min] | Peak intensities of X-ray diffraction | | | | | Intensity of precipitated Bi [at %$^{-1}$] | | |
| | | | | | $I_{Bi(102)}$ [cps] | $I_{Ag(111)}$ [cps] | $I_{Ag(200)}$ [cps] | $I_{Ag(220)}$ [cps] | $I_{Ag(311)}$ [cps] | | | |
| 1 | 0.5 | no solution treatment | | | 94 | 7840 | 2760 | 2050 | 1820 | 0.013 | 0.015 | NG |
| 2 | | 700 | 10 | 5 | 0 | 9490 | 3300 | 1930 | 1790 | 0.000 | 0.002 | G |
| 3 | | 800 | 10 | 5 | 0 | 9530 | 3350 | 1920 | 1770 | 0.000 | 0.001 | G |
| 4 | 1.5 | no solution treatment | | | 578 | 14300 | 5910 | 1790 | 2070 | 0.016 | 0.018 | NG |
| 5 | | 700 | 10 | 5 | 92 | 8940 | 2750 | 1930 | 1780 | 0.004 | 0.006 | G |
| 6 | | 800 | 10 | 5 | 46 | 9010 | 2780 | 1940 | 1750 | 0.002 | 0.004 | G |
| 7 | 3.0 | no solution treatment | | | 1225 | 13200 | 5230 | 2060 | 2200 | 0.018 | 0.020 | NG |
| 8 | | 700 | 10 | 5 | 586 | 11960 | 3710 | 1930 | 1920 | 0.010 | 0.010 | G |
| 9 | | 800 | 10 | 5 | 290 | 11850 | 3690 | 1880 | 1880 | 0.005 | 0.006 | G |
| 10 | 4.0 | no solution treatment | | | 2430 | 13800 | 5650 | 1850 | 2070 | 0.026 | 0.035 | NG |
| 11 | | 700 | 10 | 5 | 1259 | 10990 | 3850 | 1790 | 1890 | 0.017 | 0.023 | NG |
| 12 | | 800 | 10 | 5 | 965 | 11030 | 3880 | 1760 | 1880 | 0.013 | 0.018 | NG |

Intensity of precipitated Bi = [$I_{Bi(102)}/(I_{Ag(111)} + I_{Ag(200)} + I_{Ag(220)} + I_{Ag(311)})$]/Bi content in target In Table 1, sample Nos. 1-3 correspond to the Ag—Bi alloy ingot with Bi content of 0.5 at %, sample Nos. 4-6 correspond to the Ag—Bi alloy ingot with Bi content of 1.5 at %, sample Nos. 7-9 correspond to the Ag—Bi alloy ingot with Bi content of 3.0 at %, and sample Nos. 10-12 correspond to the Ag—Bi alloy ingot with Bi content of 4.0 at %. As clear from FIG. 1, implementing the solution treatment lessens the intensity of precipitated Bi, and as clear from FIG. 2, reducing the Bi content lessens the intensity of precipitated Bi. Further, as clear from Table 1, reducing the intensity of precipitated Bi improves workability of the Ag—Bi alloy ingots, thereby contributing to suppression of a material damage during hot working.

Example 2

Ag and Bi whose compositions had been adjusted were inductively melted under Ar gas atmosphere, and produced were five different kinds of Ag—Bi alloy ingots each having a different Bi content, namely, Ag with Bi of 0.5 at %, Ag with Bi of 1.0 at %, Ag with Bi of 1.5 at %, Ag with Bi of 3.0 at %, and Ag with Bi of 4.0 at % by casting the materials into metal plates with use of a mold. Two different kinds of treatments were performed with respect to each of the five Ag—Bi alloy ingots: one was no solution treatment; and the other was a solution treatment of temperature: 700(° C.)—time: 4(hr)—cooling rate: 5° C./min. After either one of the treatments was implemented, these ingots were subjected to hot rolling at a hot roll initiate temperature of 700° C., and rolling reduction of 50%, followed by cold rolling (rolling reduction: 50%) and heat treatment (temperature: 600° C., time: 1.5 hr).

Ag—Bi alloy sputtering targets (diameter: 101.6 mm, thickness: 5 mm) were obtained by cutting off discs from the heat-treated plates and machine finishing the discs. The ingots were subjected to cold rolling after damaged portions of the ingots where a material damage such as cracking appeared during the hot rolling were removed. Further, a certain number of test chips of 20 mm (length)×20 mm (width)×5 mm (thickness) necessary for implementing the experiments were cut off from the heat-treated plates after the sputtering targets were cut off.

Ag—Bi alloy films of 200 nm in thickness were formed on a glass substrate (diameter: 50.8 mm, thickness: 0.55 mm) by DC magnetron sputtering [vacuum reach: $2.0 \times 10^{-6}$ Torr or less ($2.7 \times 10^{-4}$ Pa or less), Ar gas pressure: 2.0 mTorr (0.27 Pa), sputter power: 200 W, target-substrate distance: 55 mm, substrate temperature: room temperature].

Figure 4:
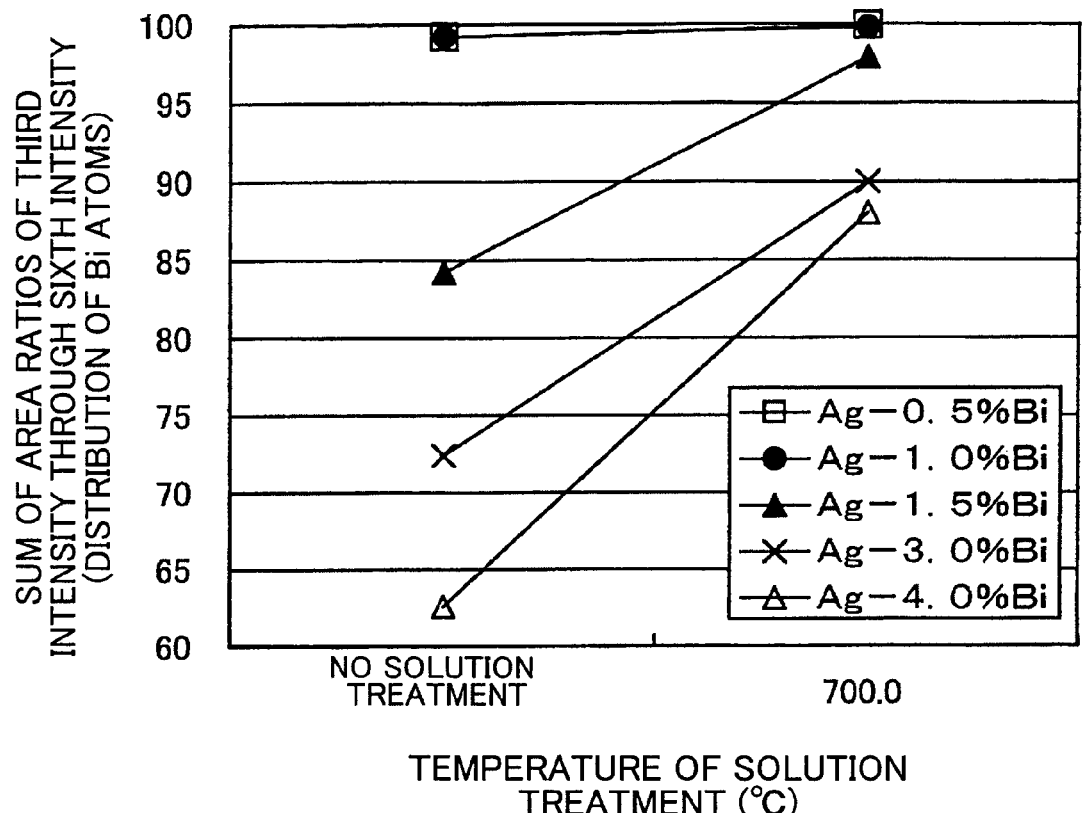
FIG. 4 is a graph showing correlations between cases where the solution treatment is implemented and a case where the solution treatment is not implemented, and distribution of Bi atoms with respect to third through sixth intensities.
Figure 5:
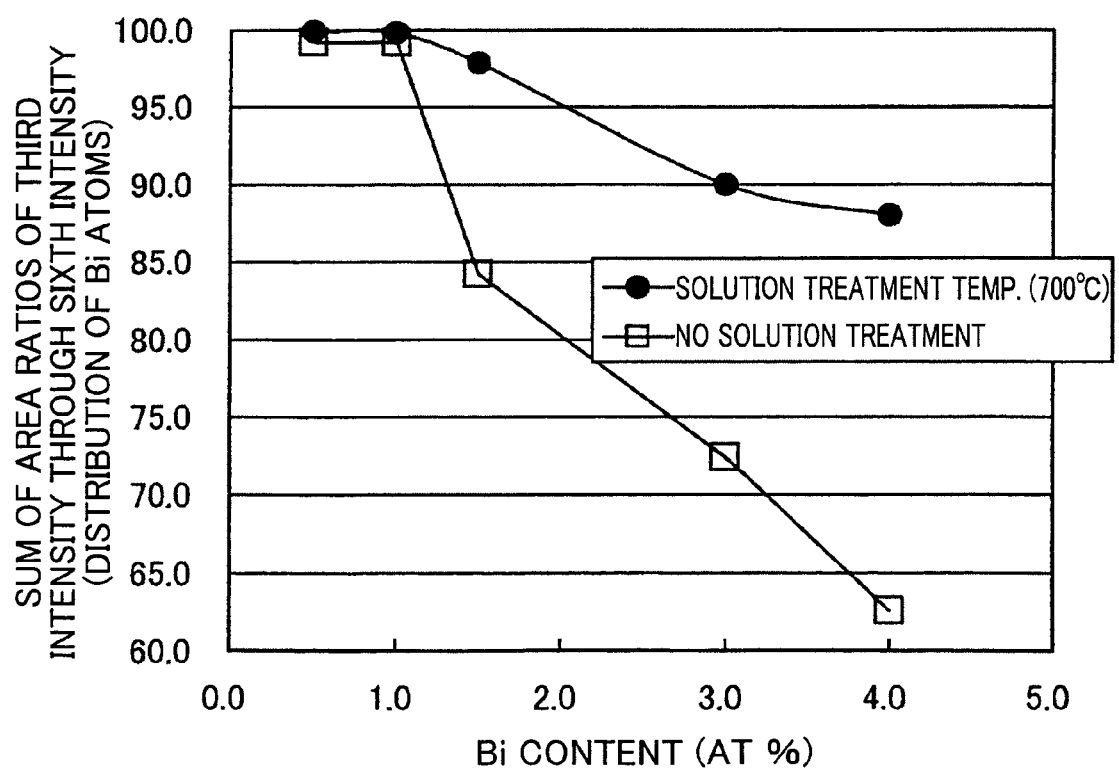
FIG. 5 is a graph showing correlations between the Bi content in sputtering targets, and distribution of Bi atoms.
Figure 6:
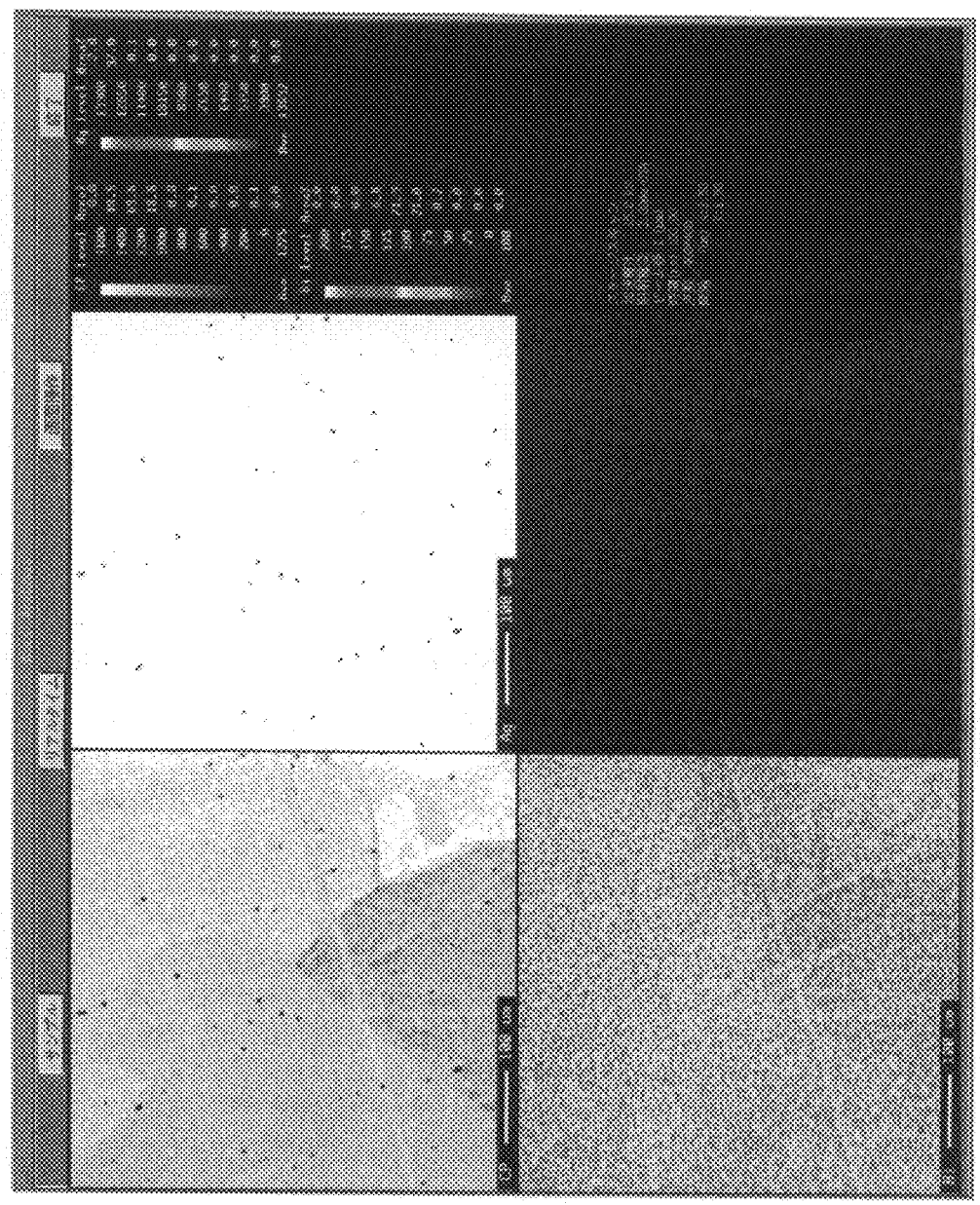
FIG. 6 is an illustration showing a screen image of X-ray microanalysis result of sample No. 14 in Example 2.
Figure 7:
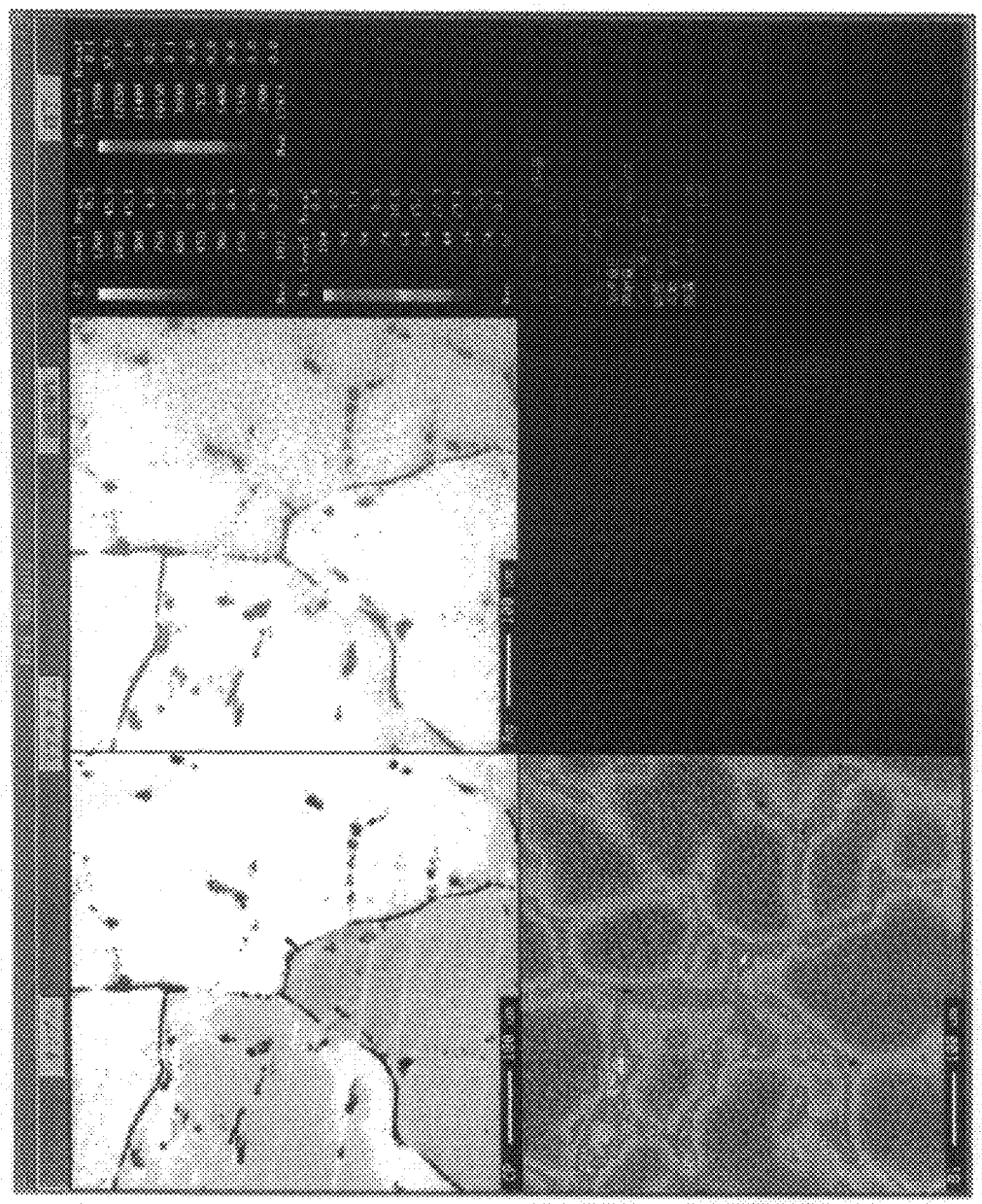
FIG. 7 is an illustration showing a screen image of X-ray microanalysis result of sample No. 21 (reference Example) in Example 2.

The evaluation results of Example 2 are shown in Table 2, and FIGS. 4 to 5. An image of X-ray microanalysis result of sample No. 14, and an image of X-ray microanalysis result of sample No. 21 are shown in FIGS. 6 and 7, respectively.

TABLE 2

| Sample No. | Bi content in target [at %] | Solution treatment conditions | | | X-ray microanalysis area ratio[%] | | | | | | | | sum of 3rd to 6th intensities (distribution of Bi atoms) | Lowering of yield of Bi content in film |
|---|---|---|---|---|---|---|---|---|---|---|---|---|---|---|
| | | Temp. [° C.] | Time [hr] | Cooling rate [° C./min] | 1st intensity | 2nd intensity | 3rd intensity | 4th intensity | 5th intensity | 6th intensity | 7th intensity | 8th intensity | | |
| 13 | 0.5 | no solution treatment | | | 0.0 | 0.3 | 9.2 | 46.8 | 36.5 | 6.7 | 0.5 | 0.1 | 99.2 | G |
| 14 | | 700 | 4 | 5 | 0.0 | 0.0 | 0.2 | 21.0 | 71.9 | 6.8 | 0.0 | 0.0 | 99.9 | G |
| 15 | 1.0 | no solution treatment | | | 0.0 | 0.4 | 10.5 | 23.4 | 55.6 | 9.7 | 0.3 | 0.1 | 99.2 | G |
| 16 | | 700 | 4 | 5 | 0.0 | 0.1 | 0.9 | 10.0 | 78.3 | 10.6 | 0.0 | 0.0 | 99.8 | G |

TABLE 2-continued

| | | Solution treatment conditions | | | X-ray microanalysis area ratio[%] | | | | | | | | sum of 3rd to 6th intensities (distribution of Bi atoms) | Lowering of yield of Bi content in film |
|---|---|---|---|---|---|---|---|---|---|---|---|---|---|---|
| Sample No. | Bi content in target [at %] | Temp. [° C.] | Time [hr] | Cooling rate [° C./min] | 1st intensity | 2nd intensity | 3rd intensity | 4th intensity | 5th intensity | 6th intensity | 7th intensity | 8th intensity | | |
| 17 | 1.5 | no solution treatment | | | 0.2 | 15.2 | 40.0 | 32.0 | 10.7 | 1.5 | 0.2 | 0.3 | 84.2 | NG |
| 18 | | 700 | 4 | 5 | 0.2 | 1.3 | 9.3 | 30.5 | 55.8 | 2.3 | 0.2 | 0.4 | 97.9 | G |
| 19 | 3.0 | no solution treatment | | | 0.6 | 13.2 | 18.9 | 23.5 | 21.1 | 8.9 | 7.5 | 6.3 | 72.4 | NG |
| 20 | | 700 | 4 | 5 | 0.4 | 2.0 | 5.5 | 37.3 | 33.0 | 14.2 | 5.0 | 2.7 | 90.0 | G |
| 21 | 4.0 | no solution treatment | | | 12.6 | 15.2 | 17.8 | 20.0 | 16.7 | 8.1 | 4.0 | 5.5 | 62.6 | NG |
| 22 | | 700 | 4 | 5 | 3.2 | 7.0 | 74.5 | 11.9 | 1.1 | 0.5 | 0.3 | 1.6 | 88.0 | NG |

In Table 2, sample Nos. 13-14 correspond to the Ag—Bi alloy ingot with Bi content of 0.5 at %, sample Nos. 15-16 correspond to the Ag—Bi alloy ingot with Bi content of 1.0 at %, sample Nos. 17-18 correspond to the Ag—Bi alloy ingot with Bi content of 1.5 at %, sample Nos. 19-20 correspond to the Ag—Bi alloy ingot with Bi content of 3.0 at %, and sample Nos. 21-22 correspond to the Ag—Bi alloy ingot with Bi content of 4.0 at %, respectively.

As clear from FIG. 4, implementing the solution treatment makes it possible to increase the sum of area ratios of the third through sixth intensities. This means that uniform distribution of Bi atoms is obtained by the solution treatment. Further, as clear from FIG. 5, reducing the Bi makes it possible to increase the sum of area ratios of the third through sixth intensities. This means that uniform distribution of Bi atoms is obtained by reducing the Bi content. Furthermore, as clear from Table 2, the uniform distribution of Bi atoms contributes to suppressing remarkable lowering of the yield of the Bi content in films obtained by sputtering.

FIGS. 6 and 7 are screen images showing results of X-ray microanalysis in each of which the image representing the planar distribution of characteristic X-ray intensities of Bi, namely, the image noted by the term of "Bi—100 μm" in the lower left section in the drawing is shown along with respective area ratios of the characteristic X-ray intensities shown in the right column titled by "Bi Level Area %" in the upper right section of the drawing, and the image representing the planar distribution of characteristic X-ray intensities of Ag, namely, the image noted by the term of "Ag—100 μm" in the upper middle section in the drawing is shown along with respective area ratios of the characteristic x-ray intensities shown in the left column titled by "Ag Level Area %" in the upper right section of the drawing. As clear from the images in the lower left section in FIGS. 6 and 7, namely, the images representing the planar distributions of characteristic X-ray intensities of Bi, sample No. 14 (see FIG. 6) in which the solid solution of Bi was formed by implementing the solution treatment exhibits uniform distribution of Bi, whereas sample No. 21 (see FIG. 7) in which the solution treatment was not implemented exhibits segregated Bi regions.

Example 3

Ingots were produced in a similar manner as producing the ingot made of the Ag—Bi alloy with Bi content of 1.5 at % in Example 1, and hot rolled plates were obtained by subjecting the ingots to hot working at a hot work initiate temperature of 650° C. and rolling reduction of 70% except that the solution treatment were differentiated from each other in the samples. After the hot rolled plates were subjected to cold rolling (rolling reduction: 50%) and heat treatment (temperature: 600° C., time: 1.5 hr), sputtering targets (diameter: 101.6 mm; thickness: 5 mm), and a certain number of test chips of 20 mm (length)×20 mm (width)×5 mm (thickness) necessary for implementing the experiments were obtained by cutting or shaving the plates.

Evaluation results of Example 3 are shown in Table 3.

TABLE 3

| Sample No. | Solution treatment conditions | | | Intensity of precipitated Bi (average) [at %$^{-1}$] | Sum of area ratios of 3rd to 6th intensities (distribution of Bi atoms) [%] | Workability | Average crystal grain size after solution treatment [μm] | Oversized growth of crystal grain |
|---|---|---|---|---|---|---|---|---|
| | Temp. [° C.] | Time [hr] | Cooling rate [° C./min] | | | | | |
| 23 | 400 | 10 | 5 | 0.010 | 96.6 | G | 67 | G |
| 24 | 700 | 10 | 5 | 0.004 | 97.4 | G | 82 | G |
| 25 | 700 | 4 | 10 | 0.007 | 98.2 | G | 44 | G |
| 26 | 700 | 4 | 5 | 0.006 | 98.0 | G | 48 | G |
| 27 | 700 | 0.5 | 5 | 0.007 | 97.6 | G | 65 | G |
| 28 | 800 | 0.5 | 5 | 0.002 | 98.5 | G | 120 | G |
| 29 | 850 | 0.5 | 5 | 0.002 | 98.6 | G | 390 | NG |

TABLE 3-continued

| Sample No. | Solution treatment conditions | | | Intensity of precipitated Bi (average) [at %$^{-1}$] | Sum of area ratios of 3rd to 6th intensities (distribution of Bi atoms) [%] | Workability | Average crystal grain size after solution treatment [μm] | Oversized growth of crystal grain |
|---|---|---|---|---|---|---|---|---|
| | Temp. [° C.] | Time [hr] | Cooling rate [° C./min] | | | | | |
| 30 | 700 | 15 | 5 | 0.003 | 97.5 | G | 320 | NG |
| 31 | 300 | 10 | 5 | 0.017 | 79.8 | NG | 60 | G |
| 32 | 700 | 0.2 | 5 | 0.018 | 85.1 | NG | 63 | G |
| 33 | 700 | 4 | 1 | 0.015 | 82.3 | NG | 84 | G |

Intensity of precipitated Bi = [$I_{Bi(102)}/(I_{Ag(111)} + I_{Ag(200)} + I_{Ag(220)} + I_{Ag(311)})$]/Bi content in target As is obvious from Table 3, in the cases where the solution treatment temperature was too low (sample No. 31), the solution treatment time was too short (sample No. 32), and the cooling rate was too slow (sample No. 33), the intensity of precipitated Bi was raised, and the sum of area ratios of the third through sixth intensities, namely, the distribution of Bi atoms was lessened, thereby lowering the workability of the Ag—Bi alloy ingots.

On the other hand, in the case where the solution treatment conditions were proper, workability was improved, thereby suppressing a material damage (sample Nos. 23 through 30). As compared with the case where the solution treatment temperature was relatively high (sample No. 29), and the case where the solution treatment time was relatively long (sample No. 30), the evaluation results of sample Nos. 23 through 28 reveal that properly setting the solution treatment conditions is effective in suppressing oversized growth of crystal grains.

Example 4

Ag and Bi whose compositions had been adjusted were inductively melted along with various supportive metal elements such as Pd, Pt, Au, Rh, Cu, Y, and Nd under Ar gas atmosphere, and produced were fourteen different kinds of Ag—Bi-base alloy ingots by casting the materials into metal plates with use of a mold. These ingots were subjected to a solution treatment of temperature: 700(° C.)—time: 5(hr)—cooling rate: 5° C./min. Thereafter, the processed ingots were subjected to hot rolling (hot roll initiate temperature: 700° C., rolling reduction: 50%), cold rolling (rolling reduction: 50%) and heat treatment (temperature: 600° C., time: 1.5 hr) in this order. Thus, sputtering targets (diameter: 101.6 mm, thickness: 5 mm), and a certain number of test chips of 20 mm (length)×20 mm (width)×5 mm (thickness) necessary for implementing the experiments were obtained by cutting or shaving the heat-treated metal plates.

Evaluation results of Example 4 are shown in Table 4.

TABLE 4

| Sample No. | Composition of sputtering target [at %] | Intensity of precipitated Bi (average) [at %$^{-1}$] | Sum of area ratios of 3rd to 6th intensities (distribution of Bi atoms) [%] | Workability | Lowering of yield of Bi content in film |
|---|---|---|---|---|---|
| 34 | Ag—1.0Bi—0.5Pd | 0.004 | 99.6 | G | G |
| 35 | Ag—1.0Bi—0.5Pt | 0.006 | 99.2 | G | G |
| 36 | Ag—1.0Bi—0.5Au | 0.005 | 99.4 | G | G |
| 37 | Ag—1.0Bi—0.5Rh | 0.006 | 99.1 | G | G |
| 38 | Ag—1.0Bi—0.5Cu | 0.005 | 99.3 | G | G |
| 39 | Ag—1.0Bi—0.5Y | 0.005 | 99.7 | G | G |
| 40 | Ag—1.0Bi—0.5Nd | 0.004 | 99.8 | G | G |
| 41 | Ag—1.0Bi—0.3Pd—0.3Cu | 0.005 | 99.4 | G | G |
| 42 | Ag—1.0Bi—0.3Au—0.3Cu | 0.006 | 99.1 | G | G |
| 43 | Ag—1.0Bi—0.3Cu—0.3Nd | 0.005 | 99.6 | G | G |
| 44 | Ag—1.0Bi—0.3Nd—0.3Pd | 0.004 | 99.7 | G | G |
| 45 | Ag—1.0Bi—0.3Nd—0.3Au | 0.005 | 99.5 | G | G |
| 46 | Ag—1.0Bi—0.2Pd—0.2Cu—0.2Nd | 0.005 | 99.4 | G | G |
| 47 | Ag—1.0Bi—0.2Au—0.2Cu—0.2Nd | 0.006 | 99.1 | G | G |

Intensity of precipitated Bi = [$I_{Bi(102)}/(I_{Ag(111)} + I_{Ag(200)} + I_{Ag(220)} + I_{Ag(311)})$]/Bi content in target In Table 4, "Ag—1.0 Bi—0.5 Pd" in sample No. 34 indicates that the alloy contains Bi of 1.0 at %, and Pd of 0.5 at %, with remaining part thereof consisting of pure Ag. The indications throughout the other sample Nos. 35 through 47 should be read in accordance with the reading of sample No. 34. As is obvious from Table 4, all the samples produced from the Ag—Bi-base alloy ingots of different compositions in Table 4 have a small intensity of precipitated Bi and a large sum of area ratios of the third through sixth intensities because the solution treatment has been conducted with respect to all the samples. Thereby, all the samples in Table 4 exhibit superior workability, thereby suppressing a material damage during hot working, and are effective in suppressing remarkable lowering of the yield of Bi content in resultant films.

To summarize the present invention, the feature of the present invention resides in that a sputtering target made of a Ag—Bi-base alloy contains Bi in solid solution with Ag. According to one aspect of the present invention, the inventive sputtering target containing Bi in solid solution, namely, the sputtering target free of Bi segregation has the following property.

Specifically, the inventive sputtering target has an average intensity of precipitated Bi of 0.01 at %$^{-1}$ or less, as represented by the following mathematical expression, under the conditions that plural sites are selected on the sputtering surface of the sputtering target, and peak intensities of X-ray diffraction are measured according to an X-ray diffraction method with respect to the Ag (111) plane, the Ag (200) plane, the Ag (220) plane, the Ag (311) plane, and the Bi (102) plane:

$$\text{intensity of precipitated Bi}=[I_{Bi(102)}/(I_{Ag(111)}+I_{Ag(200)}+I_{Ag(220)}+I_{Ag(311)})]/[Bi]$$

where: $I_{Bi(102)}$ represents a peak intensity (unit: cps, the unit is the same in the following) of X-ray diffraction with respect to the Bi(102) plane; $I_{Ag(111)}$ represents a peak intensity of X-ray diffraction with respect to the Ag (111) plane; $I_{Ag(200)}$ represents a peak intensity of X-ray diffraction with respect to the Ag (200) plane; $I_{Ag(220)}$ represents a peak intensity of X-ray diffraction with respect to the Ag (220) plane; and $I_{Ag(311)}$ represents a peak intensity of X-ray diffraction with respect to the Ag(311) plane, and [Bi] represents the Bi content (unit: at %) in the Ag—Bi-base alloy sputtering target.

According to another aspect of the present invention, the inventive sputtering target has a sum of area ratios of the third through sixth intensities of 89% or more in measuring a planar distribution of characteristic X-ray intensities on the sputtering surface of the sputtering target according to X-ray microanalysis under the conditions that the characteristic X-ray intensities are proportionally classified into 8 levels from the first intensity (lowest level) to the eighth intensity (highest level), and the respective area ratios of these 8 intensities are calculated, wherein the sum of the respective areas representing these 8 intensities is 100%.

According to yet another aspect of the present invention, it is desirable that the inventive sputtering target has an average crystal grain size of 200 μm or less. The sputtering target may be made of a Ag-base alloy with Bi content, for example, of 3 at % or less (excluding 0 at %). The inventive sputtering target may contain at least one of the first, the second, and the third supportive metal elements, wherein
the first supportive metal element is at least one selected from Mg, Pd, Pt, Au, Zn, Al, Ga, In, Sn, and Sb;
the second supportive metal element is at least one selected from Be, Ru, Rh, Os, Ir, Cu, and Ge; and
the third supportive metal element is at least one selected from Y, La, Ce, Nd, Sm, Gd, Tb, Dy, Ti, Zr, and Hf.

The inventive sputtering target can be produced by subjecting the Ag—Bi-base alloy products to the solution treatment at 350° C. or higher for 0.3 hr or longer with a cooling rate of 3° C./min. or faster. It is recommended that the solution treatment temperature be 830° C. or lower, and the solution treatment time be 13 hr or shorter in order to suppress oversized growth of crystal grains.

According to a further aspect of the present invention, provided is a method for producing films made of the Ag—Bi-base alloy obtained by sputtering the aforementioned Ag—Bi-base alloy sputtering target.

According to the inventive method, the resultant films are free of non-uniform distribution of Bi such as Bi segregation because a solid solution of Bi is formed with Ag. This arrangement is advantageous in suppressing a material damage resulting from Bi segregation, and in suppressing lowering of the yield of Bi content in the films resulting from Bi segregation.

According to the inventive method, oversized growth of crystal grains is prevented.

This application is based on Japanese Patent Application No. 2003-139293 filed on May 16, 2003, the contents of which are hereby incorporated by reference.

The patent or application file contains at least one drawing executed in color. Copies of this patent or patent application publication with color drawing(s) will be provided by the Office upon request and payment of the necessary fee.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A sputtering target for forming a Ag—Bi-base alloy film by sputtering, said sputtering target being made of a Ag—Bi-base alloy containing Bi in an amount of 0.1 to 3 at % with substantially all Bi in solid solution with Ag and being free of Cu except for unavoidable impurities, wherein the sputtering target made of a Ag—Bi-base alloy has an average intensity of precipitated Bi of 0.01 at %$^{-1}$ or less, as represented by the following mathematical expression, the average intensity being obtained by selecting plural sites on a sputtering surface of the sputtering target and by measuring peak intensities of X-ray diffraction, according to an X-ray diffraction method, with respect to the Ag (111) plane, the Ag (200) plane, the Ag (220) plane, the Ag (311) plane, and the Bi (102) plane:

$$\text{intensity of precipitated Bi}=[I_{Bi(102)}/(I_{Ag(111)}+I_{Ag(200)}+I_{Ag(220)}+I_{Ag(311)})]/[Bi]$$

where $I_{Bi(102)}$ represents a peak intensity (unit: counts per second (cps), the unit is the same in the following) of X-ray diffraction with respect to the Bi (102) plane; $I_{Ag(111)}$ represents a peak intensity of X-ray diffraction with respect to the Ag (111) plane; $I_{Ag(200)}$ represents a peak intensity of X-ray diffraction with respect to the Ag (200) plane; $I_{Ag(220)}$ represents a peak intensity of X-ray diffraction with respect to the Ag (220) plane; and $I_{Ag(311)}$ represents a peak intensity of X-ray diffraction with respect to the Ag (311) plane, and [Bi] represents a content of Bi (unit: at %) in the sputtering target made of the Ag—Bi-base alloy.

2. A sputtering target for forming a Ag—Bi-base alloy film by sputtering, said sputtering target being made of a Ag—Bi-base alloy containing Bi in an amount of 0.1 to 3 at % with substantially all Bi in solid solution with Ag and being free of Cu except for unavoidable impurities, wherein the sputtering target made of a Ag—Bi-base alloy has a sum of area ratios of a third intensity through a sixth intensity of 89% or more, the area ratios being calculated by measuring a planar distribution of characteristic X-ray intensities of Bi on a sputtering surface of the sputtering target according to X-ray microanalysis, the characteristic X-ray intensities being proportionally classified into 8 levels from a first intensity corresponding to a lowest level to an eighth intensity corresponding to a highest level, and respective area ratios of the first intensity through the eighth intensity being calculated, wherein the sum of the respective areas representing the first intensity through the eighth intensity is 100%.

3. The sputtering target according to claim 1, wherein an average crystal grain size of the sputtering target is 200 µm or less.

4. The sputtering target according to claim 2, wherein an average crystal grain size of the sputtering target is 200 µm or less.

5. The sputtering target according to claim 1, wherein the sputtering target is made of a Ag—Bi-base alloy with a content of Bi of 2 at % or less, excluding 0 at %.

6. The sputtering target according to claim 2, wherein the sputtering target is made of a Ag—Bi-base alloy with a content of Bi of 2 at % or less, excluding 0 at %.

7. The sputtering target according to claim 1, wherein at least one selected from the group consisting of first, second, and third supportive metal elements is added to secure properties of films produced from the sputtering target,
the first supportive metal element including at least one selected from the group consisting of Mg, Pd, Pt, Au, Zn, Al, Ga, In, Sn, and Sb;
the second supportive metal element including at least one selected from the group consisting of Be, Ru, Rh, Os, Ir, and Ge; and
the third supportive metal element including at least one selected from the group consisting of Y, La, Ce, Nd, Sm, Gd, Tb, Dy, Ti, Zr, and Hf.

8. The sputtering target according to claim 2, wherein at least one selected from the group consisting of first, second, and third supportive metal elements is added to secure properties of films produced from the sputtering target,
the first supportive metal element including at least one selected from the group consisting of Mg, Pd, Pt, Au, Zn, Al, Ga, In, Sn, and Sb;
the second supportive metal element including at least one selected from the group consisting of Be, Ru, Rh, Os, Ir, and Ge; and
the third supportive metal element including at least one selected from the group consisting of Y, La, Ce, Nd, Sm, Gd, Tb, Dy, Ti, Zr, and Hf.

9. The sputtering target according to claim 7, wherein a total content of the supportive metal element(s) is 5 at % or less relative to a total content of the sputtering target.

10. The sputtering target according to claim 8, wherein a total content of the supportive metal element(s) is 5 at % or less relative to a total content of the sputtering target.

11. A method for producing the sputtering target made of a Ag—Bi-base alloy according to claim 1, comprising a solution treatment step of subjecting a product made of the Ag—Bi-base alloy to a solution treatment at 350° C. or higher for 0.3 hr or longer with a cooling rate of 3° C./min or faster to form a solid solution of Bi with Ag.

12. The method according to claim 11, wherein the temperature for the solution treatment is 830° C. or lower, and the time for the solution treatment is 13 hr or shorter.

13. A method for producing the sputtering target made of a Ag—Bi-base alloy according to claim 2, comprising a solution treatment step of subjecting a product made of the Ag—Bi-base alloy to a solution treatment at 350° C. or higher for 0.3 hr or longer with a cooling rate of 3° C./min or faster to form a solid solution of Bi with Ag.

14. The method according to claim 13, wherein the temperature for the solution treatment is 830° C. or lower, and the time for the solution treatment is 13 hr or shorter.

15. A method of producing a Ag—Bi-base alloy film comprising sputtering the sputtering target according to claim 1.

16. A method of producing a Ag—Bi-base alloy film comprising sputtering the sputtering target according to claim 2.

* * * * *